United States Patent [19]

Zagar et al.

[11] Patent Number: 5,526,320
[45] Date of Patent: Jun. 11, 1996

[54] BURST EDO MEMORY DEVICE

[75] Inventors: Paul S. Zagar, Boise; Brett L. Williams, Eagle; Troy A. Manning, Boise, all of Id.

[73] Assignee: Micron Technology Inc., Boise, Id.

[21] Appl. No.: 370,761

[22] Filed: Dec. 23, 1994

[51] Int. Cl.$^6$ .................................................. G11C 8/00
[52] U.S. Cl. .............................. 365/233.5; 365/230.08; 365/238.5; 365/189.05
[58] Field of Search .................... 365/230.01, 230.06, 365/230.08, 238.5, 233.5, 235, 189.05, 236

[56] References Cited

U.S. PATENT DOCUMENTS

| | | | |
|---|---|---|---|
| 4,344,156 | 8/1982 | Eaton et al. | 365/203 |
| 4,484,308 | 11/1984 | Lewandowski et al. | 364/900 |
| 4,562,555 | 12/1985 | Ouchi et al. | 365/233 |
| 4,567,579 | 1/1986 | Patel et al. | 365/189 |
| 4,575,825 | 3/1986 | Ozaki et al. | 365/189 |
| 4,603,403 | 7/1986 | Toda | 365/189 |
| 4,618,947 | 10/1986 | Tran et al. | 365/230 |
| 4,649,522 | 3/1987 | Kirsch | 365/189 |
| 4,685,089 | 8/1987 | Patel et al. | 365/233 |
| 4,707,811 | 11/1987 | Takemae et al. | 365/239 |
| 4,788,667 | 11/1988 | Nakano | 365/193 |
| 4,875,192 | 10/1989 | Matsumoto | 365/193 |
| 5,267,200 | 11/1993 | Tobita | 365/189.05 |
| 5,268,865 | 12/1993 | Takasugi | 365/189.05 |
| 5,319,759 | 6/1994 | Chan | 365/236 |
| 5,327,390 | 7/1994 | Takasugi | 365/230.08 |
| 5,357,469 | 10/1994 | Sommer et al. | 365/193 |
| 5,392,239 | 2/1995 | Margulis et al. | 365/189.01 |
| 5,426,606 | 6/1995 | Takai | 365/230.06 |

OTHER PUBLICATIONS

Samsung Electronics, "Samsung Synchronous DRAM", Mar. 1993, pp. 1–16.
Oki Electric Ind. Co., Ltd, "Burst DRAM Function & Pinout", 2nd presentation, Item #619, Sep., 1994.
Toshiba, "Pipelined Burst DRAM", Dec. 1994, JEDEC JC–42.3 Hawaii.
Toshiba America Electronic Components, Inc., "Application Specific DRAM,, 1994", pp. C–178, C–260, C218.
Micron Semiconductor, Inc., "Synchronous DRAM2 MEG×8 SDRAM", pp. 2–43 through 2–83.
Toshiba America Electronic Components, Inc., "4M DRAM 1991", pp. A–137–A–159.
Micron Semiconductor, Inc., "1994 DRAM Data Book", entire book.
Mosel–Vitelic V53C8257H DRAM Specification Sheet, 20 pgs.

*Primary Examiner*—David C. Nelms
*Assistant Examiner*—Tan T. Nguyen
*Attorney, Agent, or Firm*—Greg A. Blodgett

[57] ABSTRACT

An integrated circuit memory device is designed for high speed data access and for compatibility with existing memory systems. An address strobe signal is used to latch a first address. During a burst access cycle the address is incremented internal to the device with additional address strobe transitions. A new memory address is only required at the beginning of each burst access. Read/Write commands are issued once per burst access eliminating the need to toggle the Read/Write control line at the device cycle frequency. Transitions of the Read/Write control line during a burst access will terminate the burst access, reset the burst length counter and initialize the device for another burst access. The device is compatible with existing Extended Data Out DRAM device pinouts, Fast Page Mode and Extended Data Out Single In-Line Memory Module pinouts, and other memory circuit designs.

49 Claims, 8 Drawing Sheets

| Burst Length | Starting Column Address | | | Linear | Interleave |
|---|---|---|---|---|---|
| | $A_2$ | $A_1$ | $A_0$ | | |
| 2 | V | V | 0 | 0-1 | 0-1 |
| | V | V | 1 | 1-0 | 1-0 |
| 4 | V | 0 | 0 | 0-1-2-3 | 0-1-2-3 |
| | V | 0 | 1 | 1-2-3-0 | 1-0-3-2 |
| | V | 1 | 0 | 2-3-0-1 | 2-3-0-1 |
| | V | 1 | 1 | 3-0-1-2 | 3-2-1-0 |
| 8 | 0 | 0 | 0 | 0-1-2-3-4-5-6-7 | 0-1-2-3-4-5-6-7 |
| | 0 | 0 | 1 | 1-2-3-4-5-6-7-0 | 1-0-3-2-5-4-7-6 |
| | 0 | 1 | 0 | 2-3-4-5-6-7-0-1 | 2-3-0-1-6-7-4-5 |
| | 0 | 1 | 1 | 3-4-5-6-7-0-1-2 | 3-2-1-0-7-6-5-4 |
| | 1 | 0 | 0 | 4-5-6-7-0-1-2-3 | 4-5-6-7-0-1-2-3 |
| | 1 | 0 | 1 | 5-6-7-0-1-2-3-4 | 5-4-7-6-1-0-3-2 |
| | 1 | 1 | 0 | 6-7-0-1-2-3-4-5 | 6-7-4-5-2-3-0-1 |
| | 1 | 1 | 1 | 7-0-1-2-3-4-5-6 | 7-6-5-4-3-2-1-0 |

FIG. 2

| PIN # | SYMBOL | PIN # | SYMBOL | PIN # | SYMBOL | PIN # | SYMBOL |
|---|---|---|---|---|---|---|---|
| 1 | Vss | 19 | A10 | 37 | NC | 55 | DQ12 |
| 2 | DQ1 | 20 | DQ5 | 38 | NC | 56 | DQ28 |
| 3 | DQ17 | 21 | DQ21 | 39 | Vss | 57 | DQ13 |
| 4 | DQ2 | 22 | DQ6 | 40 | $\overline{CAS0}$ | 58 | DQ29 |
| 5 | DQ18 | 23 | DQ22 | 41 | $\overline{CAS2}$ | 59 | Vcc |
| 6 | DQ3 | 24 | DQ7 | 42 | $\overline{CAS3}$ | 60 | DQ30 |
| 7 | DQ19 | 25 | DQ23 | 43 | $\overline{CAS1}$ | 61 | DQ14 |
| 8 | DQ4 | 26 | DQ8 | 44 | $\overline{RAS0}$ | 62 | DQ31 |
| 9 | DQ20 | 27 | DQ24 | 45 | $\overline{RAS1}$ | 63 | DQ15 |
| 10 | Vcc | 28 | A7 | 46 | $\overline{OE}$ | 64 | DQ32 |
| 11 | PD5 | 29 | NC | 47 | $\overline{WE}$ | 65 | DQ16 |
| 12 | A0 | 30 | Vcc | 48 | PD ECC | 66 | PD EDO |
| 13 | A1 | 31 | A8 | 49 | DQ9 | 67 | PD1 |
| 14 | A2 | 32 | A9 | 50 | DQ25 | 68 | PD2 |
| 15 | A3 | 33 | NC | 51 | DQ10 | 69 | PD3 |
| 16 | A4 | 34 | NC | 52 | DQ26 | 70 | PD4 |
| 17 | A5 | 35 | NC | 53 | DQ11 | 71 | PD refresh |
| 18 | A6 | 36 | NC | 54 | DQ27 | 72 | Vss |

BURST EDO MEMORY DEVICE

FIELD OF THE INVENTION

This invention relates to memory device architectures designed to provide high density data storage with high speed read and write access cycles.

BACKGROUND OF THE INVENTION

Dynamic Random Access Memory devices (DRAMs) are among the highest volume and most complex integrated circuits manufactured today. Except for their high volume production, the state of the art manufacturing requirements of these devices would cause them to be exorbitantly priced. Yet, due to efficiencies associated with high volume production, the price per bit of these memory devices is continually declining. The low cost of memory has fueled the growth and development of the personal computer. As personal computers have become more advanced, they in turn have required faster and more dense memory devices, but with the same low cost of the standard DRAM. Fast page mode DRAMs are the most popular standard DRAM today. In fast page mode operation, a row address strobe (/RAS) is used to latch a row address portion of a multiplexed DRAM address. Multiple occurrences of the column address strobe (/CAS) are then used to latch multiple column addresses to access data within the selected row. On the falling edge of /CAS an address is latched, and the DRAM outputs are enabled. When /CAS transitions high the DRAM outputs are placed in a high impedance state (tri-state). With advances in the production of integrated circuits, the internal circuitry of the DRAM operates faster than ever. This high speed circuitry has allowed for faster page mode cycle times. A problem exists in the reading of a DRAM when the device is operated with minimum fast page mode cycle times. /CAS may be low for as little as 15 nanoseconds, and the data access time from /CAS to valid output data (tCAC) may be up to 15 nanoseconds; therefore, in a worst case scenario there is no time to latch the output data external to the memory device. For devices that operate faster than the specifications require, the data may still only be valid for a few nanoseconds. On a heavily loaded microprocessor memory bus, trying to latch an asynchronous signal that is valid for only a few nanoseconds is very difficult. Even providing a new address every 35 nanoseconds requires large address drivers which create significant amounts of electrical noise within the system. To increase the data throughput of a memory system, it has been common practice to place multiple devices on a common bus. For example, two fast page mode DRAMs may be connected to common address and data buses. One DRAM stores data for odd addresses, and the other for even addresses. The /CAS signal for the odd addresses is turned off (high) when the /CAS signal for the even addresses is turned on (low). This interleaved memory system provides data access at twice the rate of either device alone.

If the first /CAS is low for 20 nanoseconds and then high for 20 nanoseconds while the second /CAS goes low, data can be accessed every 20 nanoseconds or 50 megahertz. If the access time from /CAS to data valid is fifteen nanoseconds, the data will be valid for only five nanoseconds at the end of each 20 nanosecond period when both devices are operating in fast page mode. As cycle times are shortened, the data valid period goes to zero.

There is a demand for faster, higher density, random access memory integrated circuits which provide a strategy for integration into today's personal computer systems. In an effort to meet this demand, numerous alternatives to the standard DRAM architecture have been proposed. One method of providing a longer period of time when data is valid at the outputs of a DRAM without increasing the fast page mode cycle time is called Extended Data Out (EDO) mode. In an EDO DRAM the data lines are not tri-stated between read cycles in a fast page mode operation. Instead, data is held valid after /CAS goes high until sometime after the next /CAS low pulse occurs, or until /RAS or the output enable (/OE) goes high. Determining when valid data will arrive at the outputs of a fast page mode or EDO DRAM can be a complex function of when the column address inputs are valid, when /CAS falls, the state of /OE and when /CAS rose in the previous cycle. The period during which data is valid with respect to the control line signals (especially /CAS) is determined by the specific implementation of the EDO mode, as adopted by the various DRAM manufacturers.

Methods to shorten memory access cycles tend to require additional circuitry, additional control pins and nonstandard device pinouts. The proposed industry standard synchronous DRAM (SDRAM) for example has an additional pin for receiving a system clock signal. Since the system clock is connected to each device in a memory system, it is highly loaded, and it is always toggling circuitry in every device. SDRAMs also have a clock enable pin, a chip select pin and a data mask pin. Other signals which appear to be similar in name to those found on standard DRAMs have dramatically different functionality on a SDRAM. The addition of several control pins has required a deviation in device pinout from standard DRAMs which further complicates design efforts to utilize these new devices. Significant amounts of additional circuitry are required in the SDRAM devices which in turn result in higher device manufacturing costs.

In order for existing computer systems to use an improved device having a nonstandard pinout, those systems must be extensively modified. Additionally, existing computer system memory architectures are designed such that control and address signals may not be able to switch at the frequencies required to operate the new memory device at high speed due to large capacitive loads on the signal lines. The Single In-Line Memory Module (SIMM) provides an example of what has become an industry standard form of packaging memory in a computer system. On a SIMM, all address lines connect to all DRAMs. Further, the row address strobe (/RAS) and the write enable (/WE) are often connected to each DRAM on the SIMM. These lines inherently have high capacitive loads as a result of the number of device inputs driven by them. SIMM devices also typically ground the output enable (/OE) pin making /OE a less attractive candidate for providing extended functionality to the memory devices.

There is a great degree of resistance to any proposed deviations from the standard SIMM design due to the vast number of computers which use SIMMs. Industry's resistance to radical deviations from the standard, and the inability of current systems to accommodate the new memory devices will delay their widespread acceptance. Therefore only limited quantities of devices with radically different architectures will be manufactured initially. This limited manufacture prevents the reduction in cost which typically can be accomplished through the manufacturing improvements and efficiencies associated with a high volume product.

SUMMARY OF THE INVENTION

An integrated circuit memory device with a standard DRAM pinout is designed for high speed data access and for compatibility with existing memory systems. A high speed burst mode of operation is provided where multiple sequential accesses occur following a single column address, and read data is output relative to the /CAS control signal. In the burst mode of operation the address is incremented internal to the device eliminating the need for external address lines to switch at high frequencies. Read/Write commands are issued once per burst access eliminating the need to toggle the Read/Write control line at high speeds. Only one control line per memory chip (/CAS) must toggle at the operating frequency in order to clock the internal address counter and the data input/output latches. The load on each /CAS is typically less than the load on the other control signals (/RAS, /WE and /OE) since each /CAS typically controls only a byte width of the data bus. Internal circuitry of the memory device is largely compatible with existing Extended Data Out (EDO) DRAMs. This similarity allows the two part types to be manufactured on one die with a limited amount of additional circuitry. The ability to switch between a standard non-burst mode and a high speed burst mode allows the device to be used to replace standard devices, and eliminates the need to switch to more complex high speed memory devices. Internal address generation provides for faster data access times than is possible with either fast page mode or EDO DRAMs. This high speed operation eliminates the need to interleave memory devices in order to attain a high data throughput. In contrast to the 50 megahertz interleaved memory system described above, the output data from this device will be valid for approximately 15 nanoseconds significantly easing the design of circuitry required to latch the data from the memory. The device is compatible with existing memory module pinouts including Single In-Line Memory Module (SIMM), Multi-Chip Module (MCM) and Dual In-Line Memory Module (DIMM) designs. This combination of features allows for significant system performance improvements with a minimum of design alterations.

BRIEF DESCRIPTION OF THE DRAWINGS

The features of the invention as well as objects and advantages will be best understood by reference to the appended claims, detailed description of particular embodiments and accompanying drawings where:

FIG. 2 is a table showing linear versus interleaved addressing formats;

DETAILED DESCRIPTION OF THE PREFERRED EMBODIMENTS

Figure 1:
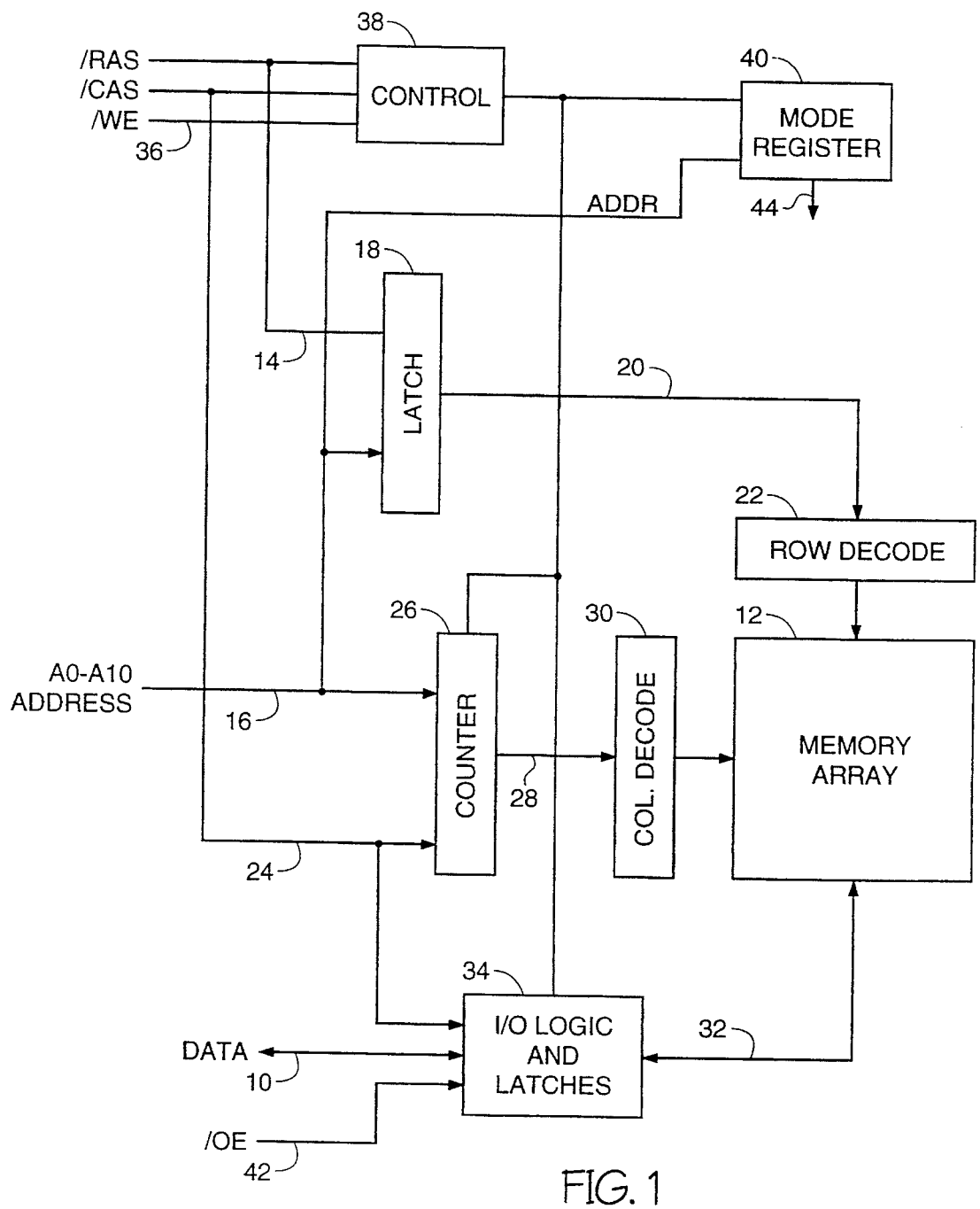
FIG. 1 is an electrical schematic diagram of a memory device in accordance with one embodiment of the invention.

FIG. 1 is a schematic representation of a sixteen megabit device designed in accordance with the present invention. The device is organized as a 2 Meg×8 burst EDO DRAM having an eight bit data input/output path 10 providing data storage for 2,097,152 bytes of information in the memory array 12. The device of FIG. 1 has an industry standard pinout for eight bit wide EDO DRAMs. An active-low row address strobe (/RAS) signal 14 is used to latch a first portion of a multiplexed memory address, from address inputs A0 through A10 16, in latch 18. The latched row address 20 is decoded in row decoder 22. The decoded row address is used to select a row of the memory array 12. A column address strobe (/CAS) signal 24 is used to latch a second portion of a memory address from address inputs 16 into column address counter 26. The latched column address 28 is decoded in column address decoder 30. The decoded column address is used to select a column of the memory array 12.

In a burst read cycle, data within the memory array located at the row and column address selected by the row and column address decoders is read out of the memory array and sent along data path 32 to output latches 34. Data 10 driven from the burst EDO DRAM may be latched external to the device in synchronization with /CAS after a predetermined number of /CAS cycle delays (latency). For a two cycle latency design, the first /CAS falling edge is used to latch the initial address for the burst access. The first burst data from the memory is driven from the memory after the second /CAS falling edge, and remains valid through the third /CAS falling edge. Once the memory device begins to output data in a burst read cycle, the output drivers 34 will continue to drive the data lines without tri-stating the data outputs during /CAS high intervals dependent on the state of the output enable and write enable (/OE and /WE) control lines, thus-allowing additional time for the system to latch the output data. Once a row and a column address are selected, additional transitions of the /CAS signal are used to advance the column address within the column address counter in a predetermined sequence. The time at which data will be valid at the outputs of the burst EDO DRAM is dependent only on the timing of the /CAS signal provided that /OE is maintained low, and /WE remains high. The output data signal levels may be driven in accordance with standard CMOS, TTL, LVTTL, GTL, or HSTL output level specifications.

The address may be advanced linearly, or in an interleaved fashion for maximum compatibility with the overall system requirements. FIG. 2 is a table which shows linear and interleaved addressing sequences for burst lengths of 2,4 and 8 cycles. The "V" for starting addresses A1 and A2 in the table represent address values that remain unaltered through the burst sequence. The column address may be advanced with each /CAS transition, each pulse, or multiple of /CAS pulses in the event that more than one data word is read from the array with each column address. When the address is advanced with each transition of the /CAS signal, data is also driven from the part after each transition following the device latency which is then referenced to each edge of the /CAS signal. This allows for a burst access cycle where the highest switching control line (/CAS) toggles only once (high to low or low to high) for each memory cycle. This is in contrast to standard DRAMs which require /CAS to go low and then high for each cycle, and synchronous DRAMs which require a full clock cycle (high and low transitions) for each memory cycle. For maximum compatibility with existing EDO DRAM devices, the invention will be further described in reference to a device designed to latch and advance a column address on falling edges of the /CAS signal.

It may be desirable to latch and increment the column address after the first /CAS falling edge in order to apply both the latched and incremented addresses to the array at the earliest opportunity in an access cycle. For example, a device may be designed to access two data words per cycle (prefetch architecture). The memory array for a prefetch architecture device may be split into odd and even array halves. The column address least significant bit is then used to select between odd and even halves while the other column address bits select a column within each of the array halves. In an interleaved access mode with column address 1, data from: columns 0 and 1 would be read and the data from column 1 would be output followed by the data from column 0 in accordance with standard interleaved addressing as described in SDRAM specifications. In a linear access mode column address 1 would be applied to the odd array half, and incremented to address 2 for accessing the even array half to fulfill the two word access. One method of implementing this type of device architecture is to provide a column address incrementing circuit between the column address counter and the even array half. The incrementing circuit would increment the column address only if the initial column address in a burst access cycle is odd, and the address mode is linear. Otherwise the incrementing circuit would pass the column address unaltered. For a design using a prefetch of two data accesses per cycle, the column address would be advanced once for every two active edges of the /CAS signal. Prefetch architectures where more than two data words are accessed are also possible.

Other memory architectures applicable to the current invention include a pipelined architecture where memory accesses are performed sequentially, but each access may require more than a single cycle to complete. In a pipelined architecture the overall throughput of the memory will approach one access per cycle, but the data out of the memory may be offset by a number of cycles due to the pipeline length and/or the desired latency from /CAS.

In the burst access memory device, each new column address from the column address counter is decoded and is used to access additional data within the memory array without the requirement of additional column addresses being specified on the address inputs 16. This burst sequence of data will continue for each /CAS falling edge until a predetermined number of data accesses equal to the burst length has occurred. A /CAS falling edge received after the last burst address has been generated will latch another column address from the address inputs 16 and a new burst sequence will begin. Read data is latched and output with each falling edge of /CAS after the first /CAS latency.

For a burst write cycle, data 10 is latched in input data latches 34. Data targeted at the first address specified by the row and column addresses is latched with the /CAS signal when the first column address is latched (write cycle data latency is zero). Other write cycle data latency values are possible; however, for today's memory systems, zero is preferred. Additional input data words for storage at incremented column address locations are latched by /CAS on successive /CAS pulses. Input data from the input latches 34 is passed along data path 32 to the memory array where it is stored at the location selected by the row and column address decoders. As in the burst read cycle previously described, a predetermined number of burst access writes will occur without the requirement of additional column addresses being provided on the address lines 16. After the predetermined number of burst writes has occurred, a subsequent /CAS pulse will latch a new beginning column address, and another burst read or write access will begin.

The memory device of FIG. 1 may include the option of switching between burst EDO and standard EDO modes of operation. In this case, the write enable signal /WE 36 may be used at the row address latch time (/RAS falling, /CAS high) to determine whether memory accesses for that row will be burst or page mode cycles. If /WE is low when /RAS falls, burst access cycles are selected. If /WE is high at /RAS falling, standard extended data out (EDO) page mode cycles are selected. Both the burst and EDO page mode cycles allow for increased memory device operating frequencies by not requiring the data output drivers 34 to place the data lines 10 in a high impedance state between data read cycles while /RAS is low. DRAM control circuitry 38, in addition to performing standard DRAM control functions, controls the I/O circuitry 34 and the column address counter/latch 26 in accordance with the mode selected by /WE when /RAS falls. In a burst mode only DRAM, or in a device designed with an alternate method of switching between burst and non-burst access cycles, the state of /WE when /RAS falls may be used to switch between other possible modes of operation such as interleaved versus linear addressing modes.

The write enable signal is used in burst access cycles to select read or write burst accesses when the initial column address for a burst cycle is latched by /CAS. /WE low at the column address latch time selects a burst write access. /WE high at the column address latch time selects a burst read access. The level of the /WE signal must remain high for read and low for write burst accesses throughout the burst access. A low to high transition within a burst write access will terminate the burst access, preventing further writes from occurring. A high to low transition on /WE within a burst read access will likewise terminate the burst read access and will place the data output 10 in a high impedance state. Transitions of the /WE signal may be locked out during critical timing periods within an access cycle order to reduce the possibility of triggering a false write cycle. After the critical timing period the state of /WE will determine whether a burst access continues, is initiated, or is terminated. Termination of a burst access resets the burst length counter and places the DRAM in a state to receive another burst access command. Both /RAS and /CAS going high during a burst access will also terminate the burst access cycle placing the data drivers in a high impedance output state, and resetting the burst length counter. Read data may remain valid at the device outputs if /RAS alone goes high while /CAS is active for compatibility with hidden refresh cycles, otherwise /RAS high alone may be used to terminate a burst access. A minimum write enable pulse width is only required when it is desired to terminate a burst read and then begin another burst read, or terminate a burst write prior to performing another burst write with a minimum delay between burst accesses. In the case of burst reads, /WE will transition from high to low to terminate a first burst read, and then /WE will transition back high prior to the next falling edge of /CAS in order to specify a new burst read cycle. For burst writes, /WE would transition high to terminate a current burst write access, then back low prior to the next falling edge of /CAS to initiate another burst write access.

A basic implementation of the device of FIG. 1 may include a fixed burst length of 4, a fixed /CAS latency of 2 and a fixed interleaved sequence of burst addresses. This basic implementation requires very little additional circuitry to the standard EDO page mode DRAM, and may be mass produced to provide the functions of both the standard EDO page mode and burst EDO DRAMs. This device also allows for the output enable pin (/OE) to be grounded for compatibility with many SIMM module designs. When not disabled (tied to ground), /OE is an asynchronous control which will prevent data from being driven from the part in a read cycle if it is inactive (high) prior to /CAS falling and remains inactive beyond /CAS rising. If these setup and hold conditions are not met, then the read data may be driven for a portion of the read cycle. It is possible to synchronize the /OE signal with /CAS, however this would typically increase the /CAS to data valid delay time and doesn't allow for the read data to be disabled prior to /RAS high without an additional /CAS low pulse which would otherwise be unnecessary. In a preferred embodiment, if /OE transitions high at any time during a read cycle the outputs will remain in a high impedance state until the next falling edge of /CAS despite further transitions of the /OE signal.

Programmability of the burst length, /CAS latency and address sequences may be accomplished through the use of a mode register 40 which latches the state of one or more of the address input signals 16 or data signals 10 upon receipt of a write-/CAS-before-/RAS (WCBR) programming cycle. In such a device, outputs 44 from the mode register control the required circuits on the DRAM. Burst length options of 2, 4, 8 and full page as well as /CAS latencies of 1, 2 and 3 may be provided. Other burst length and latency options may be provided as the operating speeds of the device increase, and computer architectures evolve. The device of FIG. 1 includes programmability of the address sequence by latching the state of the least significant address bit during a WCBR cycle. The burst length and /CAS latency for this particular embodiment are fixed. Other possible alterations in the feature sets of this DRAM include having a fixed burst mode only, selecting between standard fast page mode (non-EDO) and burst mode, and using the output enable pin (/OE) 42 in combination with /RAS to select between modes of operation. Also, a WCBR refresh cycle could be used to select the mode of operation rather than a control signal in combination with /RAS. A more complex memory device may provide additional modes of operation such as switching between fast page mode, EDO page mode, static column mode and burst operation through the use of various combinations of /WE and /OE at /RAS falling time. One mode from a similar set of modes may be selected through the use of a WCBR cycle using multiple address or data lines to encode the desired mode. Alternately, a device with multiple modes of operation may have wire bond locations, or programmable fuses which may be used to program the mode of operation of the device.

A preferred embodiment of a sixteen bit wide burst EDO mode DRAM designed in accordance with the teachings of this invention has two column address strobe input pins /CASH and /CASL. For read cycles only /CASL needs to toggle. /CASH is may be high or may toggle with /CASL during burst read cycles, all sixteen data bits will be driven out of part during a read cycle even if /CASH remains inactive. In a typical system application, a microprocessor will read all data bits on a data bus in each read cycle, but may only write certain bytes of data in a write cycle. Allowing one of the /CAS control signals to remain static during read cycles helps to reduce overall power consumption and noise within the system. For burst write access cycles, each of the /CAS signals (CASH and /CASL) acts as a write enable for an eight bit width of the data. All sixteen data inputs will be latched when the first of the /CAS signals transitions low. If only one /CAS signal transitions low, then the eight bits of data associated with the /CAS that remained high will not be stored in the memory.

The present invention has been described with reference to several preferred embodiments. Just as fast page mode DRAMs and EDO DRAMs are available in numerous configurations including x1, x4, x8 and x16 data widths, and 1 Megabit, 4 Megabit, 16 Megabit and 64 Megabit densities; the memory device of the present invention may take the form of many different memory organizations. It is believed that one who is skilled in the art of integrated circuit memory design can, with the aide of this specification design a variety of memory devices which do not depart from the spirit of this invention. It is therefore believed that detailed descriptions of the various memory device organizations applicable to this invention are not necessary.

Figure 3:
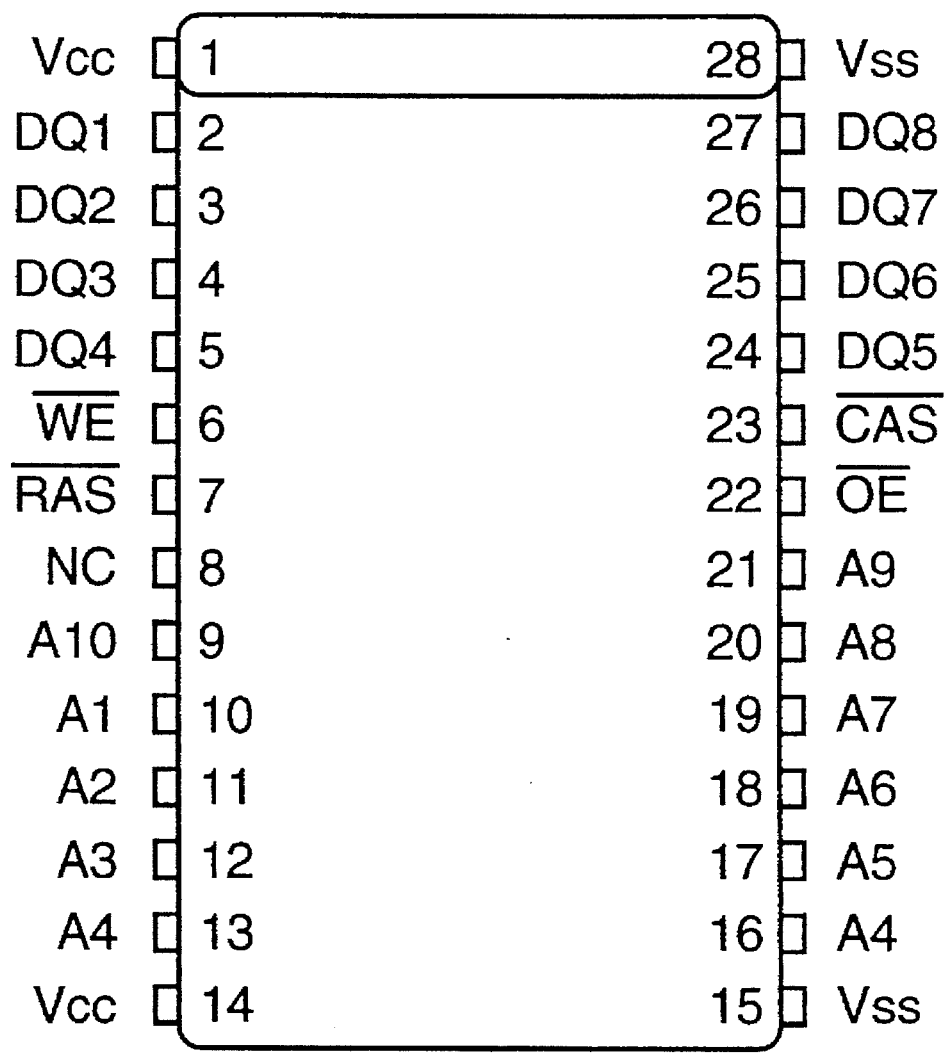
FIG. 3 is a pinout of the memory device of FIG. 1.

FIG. 3 shows a preferred pinout for the device of FIG. 1. It should be noted that the pinout for this new burst EDO memory device is identical to the pinout for a standard EDO DRAM. The common pinout allows this new device to be used in existing memory designs with minimum design changes. The common pinout also allows for ease of new designs by those of skill in the art who are familiar with the standard EDO DRAM pinout. Variations of the described invention which maintain the standard EDO DRAM pinout include driving the /CAS pin with a system clock signal to synchronize data access of the memory device with the system clock. For this embodiment, it may be desirable to use the first /CAS active edge after /RAS falls to latch the row address, a later edge may be used to latch the first column address of a burst access cycle. After row and column addresses are latched within the device, the address may be incremented internally to provide burst access cycles in synchronization with the system clock. Other pin function alternatives include driving the burst address incrementing signal on the /OE pin since the part does not require a data output disable function on this pin. Other alternate uses of the /OE pin also allow the device to maintain the standard EDO pinout, but provide increased functionality such as burst mode access. The /OE pin may be used to signal the presence of a valid column starting address, or to terminate a burst access. Each of these embodiments provides for a high speed burst access memory device which may be used in current memory systems with a minimum amount of redesign.

Figure 4:
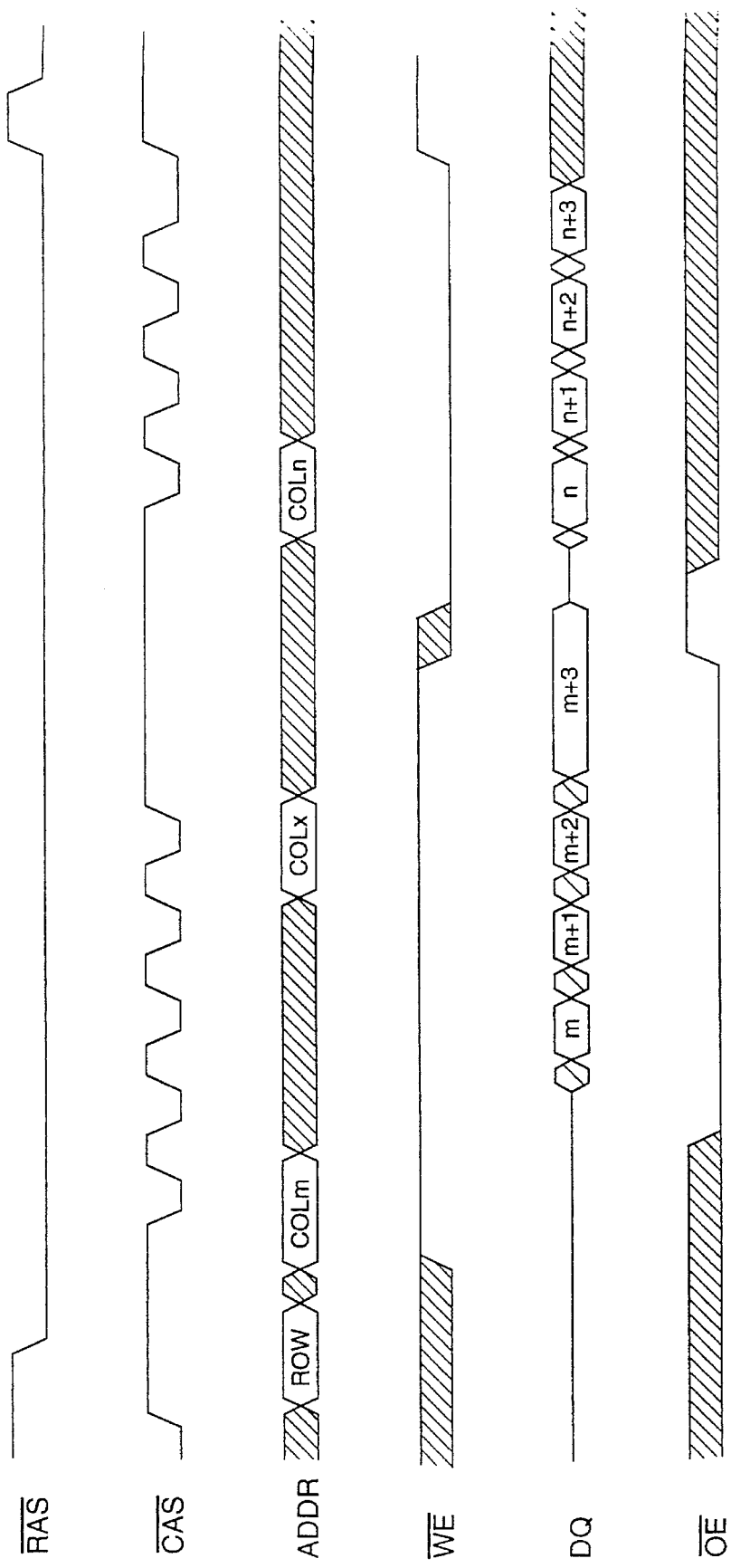
FIG. 4 is a timing diagram for a method of accessing the device of FIG. 1.

FIG. 4 is a timing diagram for performing a burst read followed by a burst write of the device of FIG. 1. In FIG. 4, a row address is latched by the /RAS signal. /WE is low when /RAS falls for an embodiment of the design where the state of the /WE pin is used to specify a burst access cycle at /RAS time. Next, /CAS is driven low with /WE high to initiate a burst read access, and the column address is latched. The data out signals (DQ's) are not driven in the first /CAS cycle. On the second falling edge of the /CAS signal, the internal address generation circuitry advances the column address and begins another access of the array, and the first data out is driven from the device after a /CAS to data access time (tCAC). Additional burst access cycles continue, for a device with a specified burst length of four, until the fifth falling edge of /CAS which latches a new column address for a new burst read access. /WE falling in the fifth /CAS cycle terminates the burst access, and initializes the device for additional burst accesses. The sixth falling edge of /CAS with /WE low is used to latch a new burst address, latch input data and begin a burst write access of the device. Additional data values are latched on successive /CAS falling edges until /RAS rises to terminate the burst access.

Figure 5:
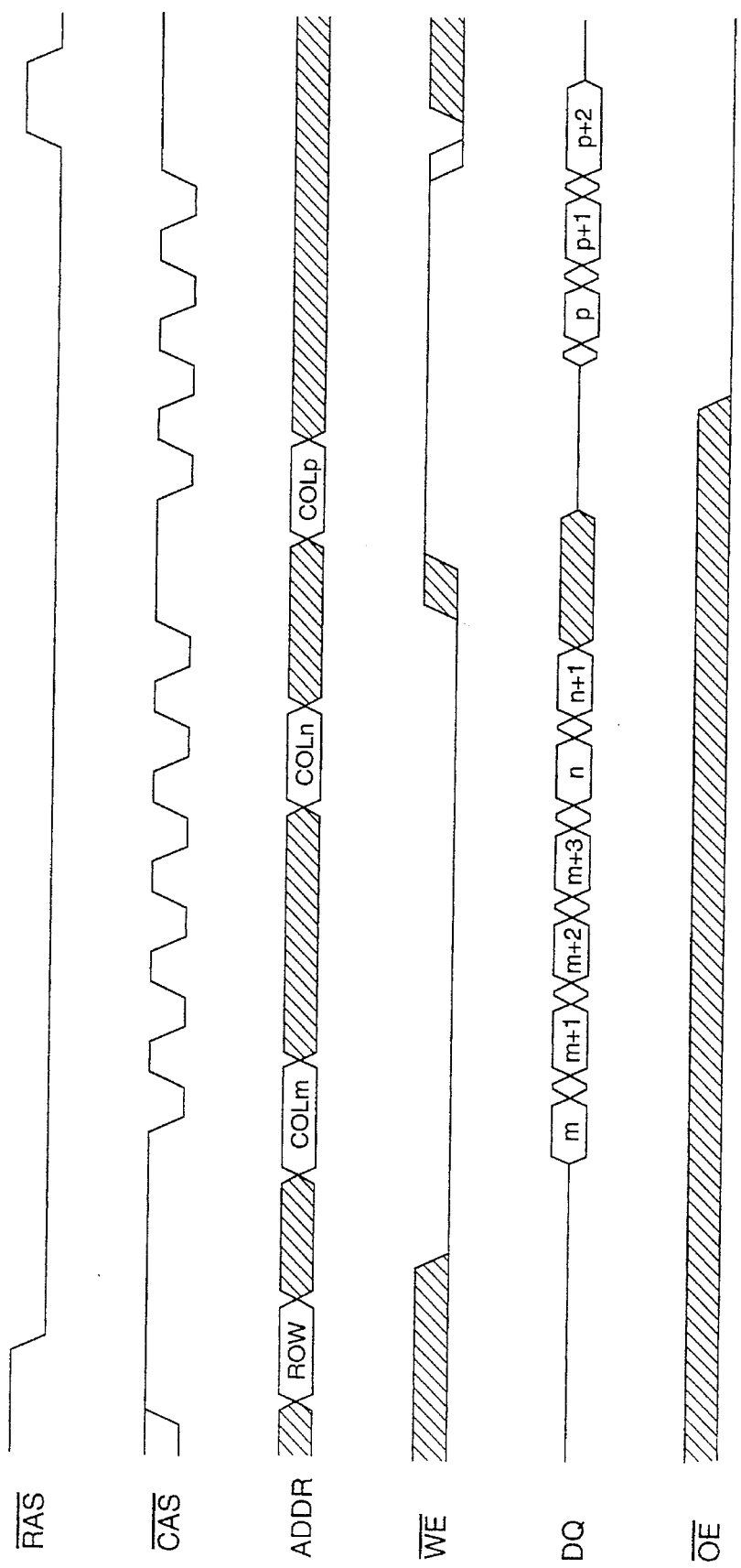
FIG. 5 is a further timing diagram for accessing the device of FIG. 1.

FIG. 5 is a timing diagram depicting burst write access cycles followed by burst read cycles. As in FIG. 4, the /RAS signal is used to latch the row address. The first /CAS falling edge in combination with /WE low begins a burst write access with the first data being latched. Additional data values are latched with successive /CAS falling edges, and the memory address is advanced internal to the device in either an interleaved or sequential manner. On the fifth /CAS falling edge a new column address and associated write data are latched. The burst write access cycles continue until the /WE signal goes high in the sixth /CAS cycle. The transition of the /WE signal terminates the burst write access. The seventh /CAS low transition latches a new column address and begins a burst read access (/WE is high). The burst read continues until /RAS rises terminating the burst cycles.

It should be noted from FIGS. 3 and 4, that for burst read cycles the data remains valid on the device outputs as long as the /OE pin is low, except for brief periods of data transition. Also, since the /WE pin is low prior to or when /CAS falls, the data input/output lines are not driven from the part during write cycles, and the /OE pin is a "don't care". Only the /CAS signal and the data signals toggle at relatively high frequency, and no control signals other than /CAS are required to be in an active or inactive state for one /CAS cycle time or less. This is in contrast to SDRAMs which often require row address strobes, column address strobes, data mask, and read/write control signals to be valid for one clock cycle or less for various device functions. Typical DRAMs also allow for the column address to propagate through to the array to begin a data access prior to /CAS falling. This is done to provide fast data access from /CAS falling if the address has been valid for a sufficient period of time prior to /CAS falling for the data to have been accessed from the array. In these designs an address transition detection circuit is used to restart the memory access if the column address changes prior to /CAS falling. This method actually requires additional time for performing a memory access since it must allow for a period of time at the beginning of each memory cycle after the last address transition to prepare for a new column address. Changes in the column address just prior to /CAS falling may increase the access time by approximately five nanoseconds. An embodiment of the present invention will not allow the column address to propagate through to the array until after /CAS has fallen. This eliminates the need for address transition detection circuitry, and allows for a fixed array access relative to /CAS.

Figure 6:
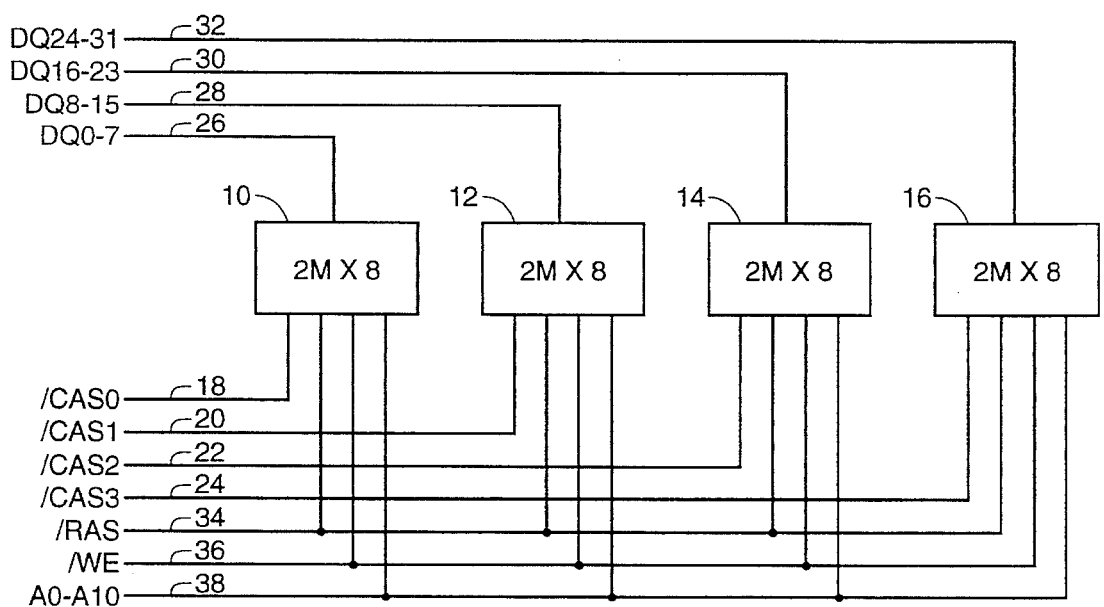
FIG. 6 is an electrical schematic diagram of a Single In-Line Memory Module in accordance with another embodiment of the invention.

FIG. 6 is a schematic representation of a single in-line memory module (SIMM) designed in accordance with the present invention. The SIMM has a standard SIMM module pinout for physical compatibility with existing systems and sockets. Functional compatibility with EDO page mode SIMMs is maintained when each of the 2 Meg×8 memory devices 10, 12, 14 and 16 are operated in an EDO page mode. Each of the /CAS signals 18, 20, 22 and 24 control one byte width of the 32 bit data bus 26, 28, 30 and 32. A /RAS 34 signal is used to latch a row address in each of the memory devices, and is used in combination with /WE 36 to select between page mode and burst mode access cycles. Address signals 38 provide a multiplexed row and column address to each memory device on the SIMM. In burst mode, only active /CAS control lines are required to toggle at the operating frequency of the device, or at half the frequency if each edge of the /CAS signal is used as described above. The data lines are required to be switchable at half the frequency of the /CAS lines or at the same frequency, and the other control and address signals switch at lower frequencies than /CAS and the data lines. As shown in FIG. 6, each /CAS signal and each data line is connected to a single memory device allowing for higher frequency switching than the other control and address signals. Each of the memory devices 10, 12, 14 and 16 is designed in accordance with the present invention allowing for a burst mode of operation providing internal address generation for sequential or interleaved data access from multiple memory address locations with timing relative to the /CAS control lines after a first row and column address are latched.

Figures 7, 8:
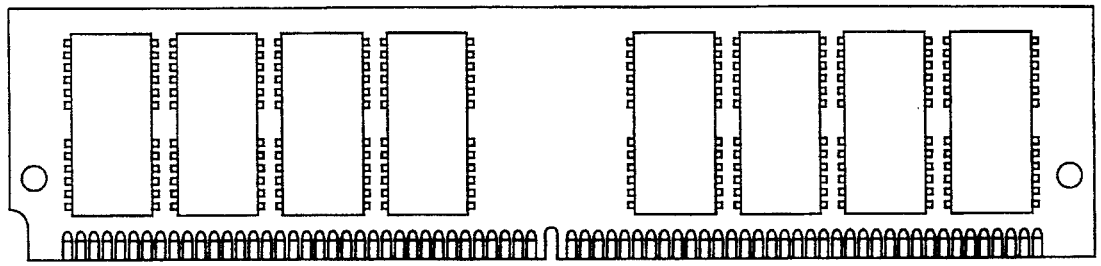
FIG. 7 is a front view of a Single In-Line Memory Module designed in accordance with the teachings of this invention.
FIG. 8 is a table of the pin numbers and signal names of the Single In-Line Memory Module of FIG. 7.

FIG. 7 shows a front view of another SIMM designed in accordance with the present invention. Each device on the SIMM is a 4 Megabit DRAM organized as 1 Meg×4. In this configuration, a single /CAS controls two memory devices to provide access to a byte width of the data bus. The eight devices shown form a 4 Megabyte SIMM in a 32 bit width. For an 8 Megabyte SIMM in a 32 bit width, there are eight additional devices on the back side (not shown).

FIG. 8 shows a preferred pinout for a memory module designed in accordance with the device of FIG. 7. This pinout is compatible with pinouts for Fast Page Mode SIMMs and EDO SIMMs. A presence detect pin is provided for indication of EDO operation on pin 66, and in accordance with standard EDO part types, an /OE input is provided on pin 46.

Alternate embodiments of the SIMM modules of FIGS. 5, 6 and 7 include the use of two /RAS signals with each controlling a sixteen bit width of the data bus in accordance with standard SIMM module pinouts. Four more 2M×8 EDO Burst Mode DRAMs may be added to the device of FIG. 6 to provide for a 4M×32 bit SIMM. Sixteen bit wide DRAMs may also be used, these will typically have two /CAS signals each of which controls an eight bit data width. The incorporation of parity bits, or error detection and correction circuitry provide other possible SIMM module configurations. Methods of performing error detection and/or correction are well known to those of skill in the art, and detailed descriptions of such circuits are not provided in this application. Additional SIMM designs using the novel memory device of the present invention may be designed by one of skill in the art with the aid of this specification. The invention has been described with reference to SIMM designs, but is not limited to SIMMs. The invention is equally applicable to other types of memory modules including Dual In-Line Memory Modules (DIMMs) and Multi-Chip Modules (MCMs).

Figure 9:
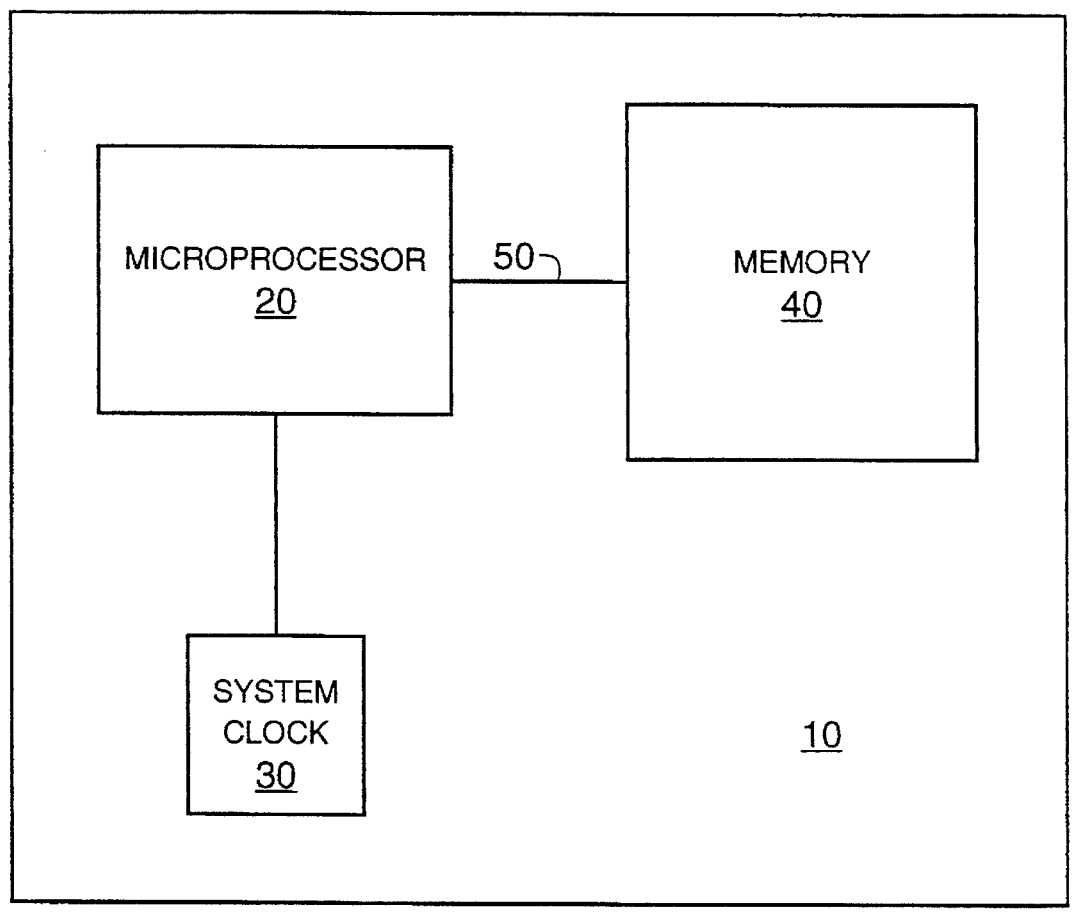
FIG. 9 is a block diagram of a computer system in accordance with the present invention.

FIG. 9 is a block diagram of a computer system 10 in accordance with the present invention. In a preferred embodiment of the present invention, microprocessor 20 is coupled to Burst EDO memory 40 through address, data and control signals 50. A system clock circuit 30 provides a system clock to the microprocessor. The memory 40 is responsive to the microprocessor to perform burst mode read and write access cycles.

What is claimed is:

1. A memory device having a plurality of memory elements, each of the elements having an associated address, the memory device further comprising:

addressing circuitry adapted to receive at least a first portion of an address from a source external to the memory device in response to a transition of an address strobe signal, and further adapted to advance the address in a predetermined address sequence in response to a subsequent transition of the address strobe signal; and output buffer circuitry adapted to drive data from the memory device only after a plurality of transitions of the address strobe signal in a burst read access.

2. The memory device of claim 1, wherein:

said output buffer circuitry is further adapted to switch between a logic low data value and a logic high data value in response to a single transition of the address strobe signal.

3. The memory device of claim 1, wherein:

said output buffer circuitry is further adapted to drive a logic low data value from the device after a falling edge of the address strobe signal, and then to drive a logic high data value from the device after a rising edge of the address strobe signal.

4. A memory device having a plurality of memory elements, each of the elements having an associated address, the memory device further comprising:

addressing circuitry adapted to provide a series of addresses in a burst mode of operation; and a write enable signal node for receiving a write enable signal which is adapted to select between read and write cycles of the memory device, wherein a burst access of the memory device is terminated in response to a transition of the write enable signal.

5. A memory device having an address latch node for receiving an address strobe signal, an address latch for receiving at least a portion of a first memory address and an array of memory elements, the memory device comprising:

an address generating circuit responsive to the address strobe signal and to an output of the address latch for generating a second memory address, wherein the second memory address is used to access the array; and an output circuit in electrical communication with the address latch node for driving data received from the array, out of the memory device after a plurality of transitions of the address strobe signal.

6. The memory device of claim 5, wherein:

said output circuit is adapted to drive data out of the memory device after a programmable number of transitions of the address strobe signal.

7. The memory device of claim 5, further comprising:

an output enable signal node for receiving an output enable signal for enabling data to be driven from the memory device; and means for performing burst read and burst write access cycles while said output enable signal node is connected to a supply potential node which defines a state of the output enable signal for enabling data to be driven.

8. The memory device of claim 5, wherein said address latch receives a column portion of the first address, the memory device further comprising:

a row address strobe signal node for receiving a row address strobe signal;

a row address latch coupled to said row address strobe signal node for latching a row address in response to the row address strobe signal;

a control signal node for receiving a control signal; and a mode control latch in electrical communication with said control signal node and said row address strobe signal node, for latching a state of the control signal upon a transition of the row address strobe signal, wherein the state is used to select between a burst mode and a nonburst mode of the memory device.

9. The memory device of claim 8 wherein:

said control signal node is a write cycle enable signal node.

10. The memory device of claim 5, wherein:

said address generating circuit latches a first column address in response to a first transition of the address strobe signal, and advances the first column address to generate a second column address in response to a second transition of the address strobe signal.

11. The memory device of claim 5, wherein:

said address latch comprises a transparent latch.

12. A memory device having an address strobe signal node for receiving an address strobe signal and an array of memory elements, the memory device comprising:

an address latch responsive to a first transition of the address strobe signal to latch at least a portion of a first initial memory address into the memory device;

an address generating circuit adapted to generate a series of burst addresses which are determinable from the first initial memory address, wherein each of the burst addresses is generated in response to a corresponding transition of the address strobe signal; and a control circuit in electrical communication with said address latch and the address strobe signal node for enabling said address latch to latch at least a portion of a second initial address into the memory device in response to the address strobe signal after a predetermined number of burst access cycles have occurred.

13. The memory device of claim 12, wherein:

the predetermined number of burst access cycles is a programmable number.

14. The memory device of claim 12, further comprising:

a write enable signal node for receiving a write enable signal, wherein a burst access of the memory device is interrupted in response to a transition of the write enable signal.

15. A memory device having a plurality of data nodes for receiving and driving a plurality of data signals, an array of memory elements, and a plurality of address nodes for receiving a row and a column address, the memory device comprising:

a row address strobe node for receiving a row address strobe signal for latching the row address in the memory device;

a write control signal node for receiving a write control signal for selecting between read and write accesses of the memory device; and first and second column address strobe nodes for receiving first and second column address strobe signals, wherein either of said first and second column address strobe signals latch the column address, and either of said first and second column address strobe signals being active during a read access of the memory device will enable data to be driven on each of the data nodes, and only a first plurality of the data signals will be stored in the array in response to said write control signal selecting a write access and said first column address strobe node being active and said second column address strobe node being inactive.

16. A memory device having an array of memory elements, in which a row address has been selected, comprising:

a means of selecting a first column address and accessing an element of the array of memory elements at the row and first column address, in response to a transition of a column address strobe signal; and a means for modifying the first column address within the memory device to provide a second column address and for accessing a further element of the array, in response to the column address strobe signal;

an output buffer to provide output data from the memory device only after a plurality of transitions of the column address strobe signal in a burst read access; and a control circuit responsive to a write enable signal to terminate a burst access of the memory device.

17. The memory device according to claim 16, further comprising:

a burst mode enable means for enabling a burst mode of operation of the memory device.

18. The memory device according to claim 16, further comprising:

a means for disabling a burst mode of operation of the memory device.

19. The memory device according to claim 18, further comprising:

a mode control latch for latching a mode of operation of the memory device when the row address is selected.

20. The memory device according to claim 16, further comprising:

a row address strobe signal node for receiving a row address strobe signal to select the row address;

a write enable input node for receiving the write enable signal; and a mode control latch circuit coupled to said write enable input node and at least one of said address signal input nodes for latching a mode of operation of the memory device in response to an active state of the write enable signal when the row address strobe signal is activated subsequent to the column address strobe signal being activated.

21. A memory device having external nodes for receiving a plurality of signals consisting essentially of a column address strobe signal a cycle of which defines an access cycle period, a row address strobe signal, a write enable signal, an output enable signal, address signals, data signals and power supply signals, the memory device comprising:

means for performing a burst write access of a first plurality of memory elements in response to a first address and a first plurality of transitions of the column address strobe signal, and for performing a burst read access of a second plurality of memory elements in response to a second address and a second plurality of transitions of the column address strobe signal, wherein a transition of the write enable signal will terminate a burst access of the memory device.

22. The memory device according to claim 21, further comprising:

a data output circuit for driving data from the memory device in the burst read access, wherein a first data signal from a third plurality of memory elements is driven from the memory device in a next burst read access subsequent to a last data signal of the second plurality of memory elements being driven from the memory device, providing for a continuous series of burst read memory cycles.

23. A method of reading data from a memory device having an address latch, an address counter, an address strobe node for receiving a column address strobe, an output data driver and an array of memory elements, the method comprising:

applying a first column address strobe to the address strobe node for latching a first column address;

accessing a first memory element of the array of memory elements at the first column address;

applying a second column address strobe to the address strobe node for advancing the column address within the memory device to specify a second column address;

accessing a second memory element of the array of memory elements at the second column address;

switching data driven to an external data node from a logic low level to a logic high level in response to a single transition of the column address strobe; and maintaining a high impedance state on the output data driver at least until said step of applying the second column address strobe.

24. The method of reading data from a memory device according to claim 23, further comprising:

applying a third column address strobe to the address strobe node for advancing the column address to specify a third column address; and latching an output of the memory device from the first column address in synchronization with the third column address strobe.

25. The method of reading data from a memory device according to claim 23, further comprising:

selecting a burst mode of operation of the memory device prior to said applying the first column address strobe.

26. A method of terminating a burst access of a memory device having an array of memory elements, an address generation circuit for providing a plurality of addresses for accessing the array, and a read and write cycle input node for receiving a write enable signal, the method comprising:

toggling the write enable signal during the burst access.

27. The method according to claim 26, further comprising:

resetting a burst length counter in response to said toggling the write enable signal during the burst access.

28. A Single In Line Memory Module comprising:

a memory device having an array of memory elements, each of the memory elements having an associated address;

a plurality of address lines coupled to said memory device; and an address strobe signal line electrically coupled to said memory device, wherein said memory device is responsive to an address strobe signal received on said address strobe signal line to latch an address within said memory device from said plurality of address lines, and said memory device is responsive to a transition of the address strobe signal received on said address strobe signal line to advance the address within said memory device in a predetermined sequence.

29. The Single In Line Memory Module according to claim 28, wherein said memory chip further comprises:

a data node for driving data from the Single In Line Memory Module, wherein driven data is switched from a first data value to a second data value in response to a single transition of the address strobe signal.

30. The Single In Line Memory Module according to claim 29, wherein:

a first transition of the address strobe signal is used to latch a first address within the memory device; and the first data value from the first address of the memory device is driven from said data node in response to a second transition of the address strobe signal.

31. The Single In Line Memory Module according to claim 28, further comprising:

a means for inhibiting the address strobe signal from advancing the address.

32. The Single In Line Memory Module according to claim 28, further comprising:

a write cycle control line for selecting a write access of said memory chip when a write enable signal on said write cycle control line is active at a time when said address strobe signal line latches the address, and for terminating a burst access of said memory chip.

33. The Single In Line Memory Module according to claim 28, wherein the memory chip further comprises an output enable signal node coupled to a ground potential node of the Single In Line Memory Module.

34. A Memory Module comprising:

a memory device;

a plurality of address signal lines coupled to said memory device to provide an address to said memory device;

an address strobe signal line coupled to said memory device; and an address generation circuit within said memory device, coupled to said address strobe signal line, for receiving and advancing the address, to provide multiple data accesses of said memory device in synchronization with multiple transitions of an address strobe signal on said address strobe signal line after only one address is received.

35. The Memory Module according to claim 34, further comprising:

a control signal line; and a write enable signal line used in combination with said address strobe signal line for selecting between read and write data accesses of said memory device, and used in combination with said control signal line for selecting between a synchronous burst access cycle and an asynchronous nonburst access cycle of said memory device.

36. The Memory Module according to claim 34, further comprising:

a write enable signal line for receiving a write enable signal, wherein a transition of said write enable signal on said write enable signal line during a burst access cycle terminates the burst access cycle.

37. The Memory Module according to claim 34, further comprising:

at least one data node for transferring data to and from the memory module, wherein data from the memory module transitions from a first data value to a second data value in response to a single transition of the signal on said address strobe signal line and data is driven from the memory module only after a plurality of transitions of the signal on said address strobe signal line in a burst read access of the memory module.

38. A computer system which is capable of rapid storage and retrieval of data, comprising:

a microprocessor; and a memory circuit adapted to store and retrieve data in a burst access in response to a memory address received from said microprocessor and in response to an address strobe signal, wherein said memory circuit is adapted to latch the memory address and perform a first memory access in response to a first transition of the address strobe signal within the burst access and is further adapted to generate an additional memory address and perform a memory access cycle in response to each of a plurality of additional transitions of the address strobe signal within a burst access.

39. The computer system of claim 38, wherein data read from the memory address of said memory circuit is provided by said memory circuit to said microprocessor after at least two transitions of the address strobe signal in the burst access.

40. The computer system of claim 39, wherein additional data values from a predetermined sequence of addresses of said memory circuit are provided to said microprocessor in response to additional transitions of the address strobe signal after said microprocessor receives data from the memory address.

41. The computer system of claim 38, wherein said memory circuit comprises dynamic random access memory elements.

42. A computer system comprising:

a microprocessor that provides an address; and a memory device containing data at a location corresponding to the address, said memory providing burst access in response to the address, wherein burst access comprises:

a plurality of periods, a column address strobe signal being received by said memory each period;

a column address portion, of the address, being received by said memory device only in a first period of the plurality of periods in response to the column address strobe signal; and the data at the location corresponding to the address is provided at an output of said memory device after at least two periods.

43. The computer system of claim 42, wherein said memory device is attached to a single in line memory module.

44. The computer system of claim 42, wherein the column address strobe signal is provided to said memory device from the computer system in synchronization with a system clock signal.

45. A computer system which is capable of rapid storage and retrieval of data, comprising:

a microprocessor; and a burst extended data out memory device to store and retrieve data in a burst access in response to a memory address received from said microprocessor and in response to an address strobe signal, whereby said burst extended data out memory device is operative to latch the memory address and perform a first memory access in response to a first transition of the address strobe signal within the burst access and is further operative to generate an additional memory address and perform a memory access cycle in response to each of a plurality of additional transitions of the address strobe signal within the burst access.

46. The computer system of claim 45, wherein the burst access is terminated in response to a transition of a write enable signal received by said burst extended data out memory device.

47. A burst access memory device comprising:

an array of memory elements;

a column addressing circuit coupled to said array of memory elements, responsive to a column address strobe signal to generate a series of column addresses in a burst access of the memory device; wherein the burst access memory device is responsive to a transition of a write cycle control signal to terminate the burst access.

48. The burst access memory device of claim 47, wherein data from said burst access memory device is driven from said burst access memory device only after at least two high to low transitions of the column address strobe signal in a burst read access.

49. The burst access memory device of claim 48, further comprising:

an output enable node adapted to receive an output enable signal; and a data output node; wherein data from the burst access memory device becomes valid at the data output node within a predetermined period after a high to low transition of the column address strobe signal in the burst read access while the output enable signal is active.

\* \* \* \* \*